(12) United States Patent
Takahashi (10) Patent No.: US 8,307,779 B2
(45) Date of Patent: Nov. 13, 2012

(54) COATING APPARATUS

(75) Inventor: Ryouichi Takahashi, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 396 days.

(21) Appl. No.: 12/614,629

(22) Filed: Nov. 9, 2009

(65) Prior Publication Data
US 2010/0116200 A1 May 13, 2010

(30) Foreign Application Priority Data

Nov. 10, 2008 (JP) ................................. 2008-287927

(51) Int. Cl.
*B05C 5/02* (2006.01)
(52) U.S. Cl. .......................... 118/300; 118/305; 118/323
(58) Field of Classification Search .................. 118/300, 118/305, 629, 410, 323; 427/356, 427.1, 427/427.2, 427.3, 458; 239/690–708
See application file for complete search history.

(56) References Cited

U.S. PATENT DOCUMENTS

| 7,690,324 B1 * | 4/2010 | Feng et al. ........................ 118/52 |
| 2009/0225950 A1 | 9/2009 | Yonezawa et al. | |

FOREIGN PATENT DOCUMENTS

| JP | 63-58674 | 4/1988 |
|---|---|---|
| JP | 9-290194 | 11/1997 |
| JP | 9-308855 | 12/1997 |
| JP | 11-104555 | 4/1999 |
| JP | 11-226471 | 8/1999 |
| JP | 2000-167467 | 6/2000 |
| JP | 2004-199975 | 7/2004 |
| JP | 2004-209463 | 7/2004 |
| JP | 2006-7061 | 1/2006 |
| JP | 2006-88130 | 4/2006 |
| JP | 2006-153971 | 6/2006 |
| JP | 2007-319952 | 12/2007 |

OTHER PUBLICATIONS

Office Action issued on Feb. 15, 2011 in the corresponding Japanese Patent Application No. 2008-287927 (with English Translation).
Electrostatics Handbook, published by Keyence, 2008, 19 pages.

* cited by examiner

*Primary Examiner* — Laura Edwards
(74) *Attorney, Agent, or Firm* — Oblon, Spivak, McClelland, Maier & Neustadt, L.L.P.

(57) ABSTRACT

A coating apparatus includes, a container unit which contains liquid, a container support unit which supports the container unit, a work support unit which supports a work oppositely to a discharge unit of the liquid in the container unit, a base unit which supports the container support unit, and is grounded, and an insulating unit which is provided between the base unit and discharge unit, and insulates the base unit and discharge unit.

7 Claims, 8 Drawing Sheets

COATING APPARATUS

CROSS-REFERENCE TO RELATED APPLICATIONS

This application is based upon and claims the benefit of priority from prior Japanese Patent Application No. 2008-287927, filed Nov. 10, 2008, the entire contents of which are incorporated herein by reference.

BACKGROUND OF THE INVENTION

1. Field of the Invention

The present invention relates to a coating apparatus which applies conductive liquid such as paste material to a predetermined area of a work.

2. Description of the Related Art

In manufacturing a flat panel display such as a liquid crystal display (LCD), a coating apparatus is used to apply a coat of conductive paste material for electrically connecting two liquid crystal substrates.

Figure 10:
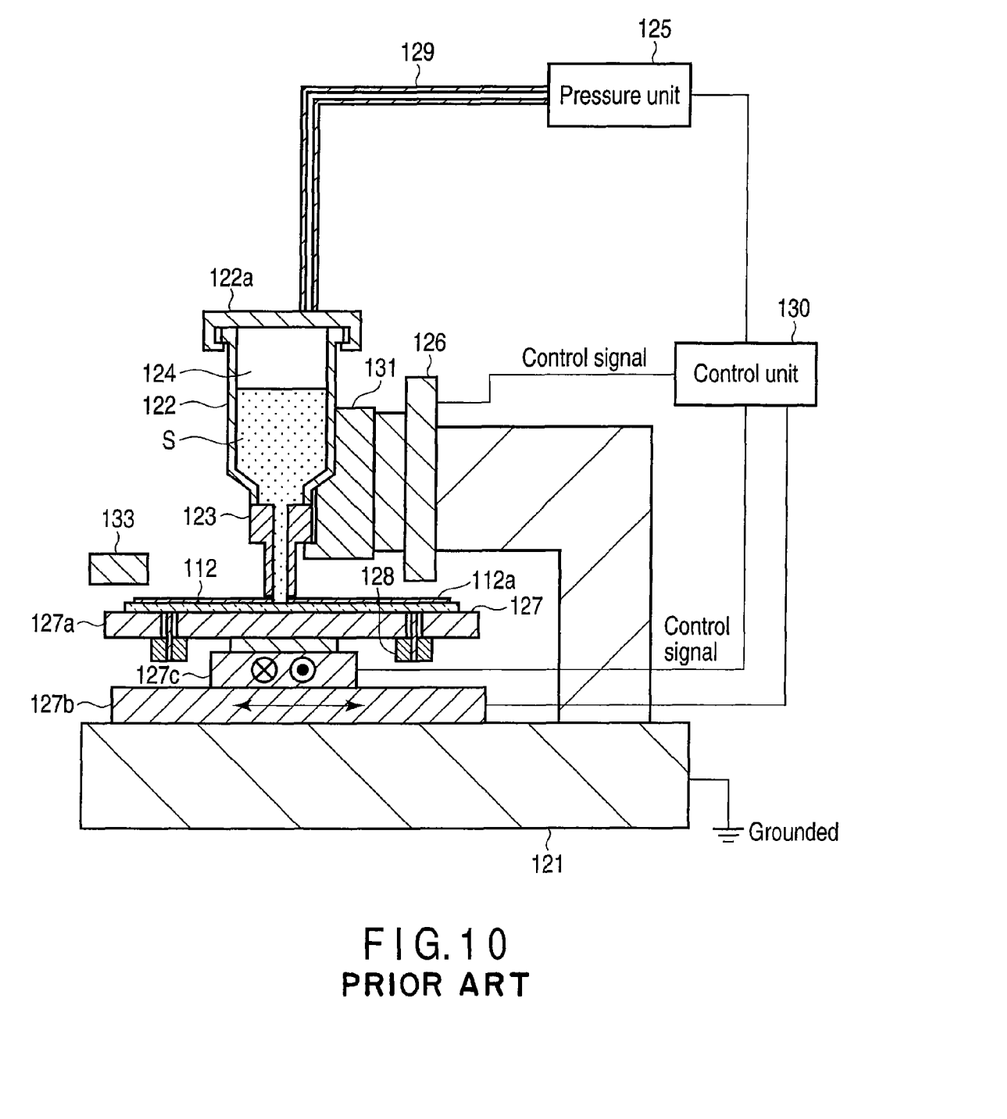
FIG. 10 is an explanatory drawing showing a configuration of an example of a paste coating apparatus.

A coating apparatus 100 shown in FIG. 10 comprises a base unit 121, a container unit 122 which is supported movably up and down on the base unit 121, a pressure unit 125 which supplies compressed air to the inside of the container unit 122, and discharges paste material S from a discharge unit 123a provided at the front end of a container, a work support unit 127 which holds a work movably, an upthrust mechanism 128 which moves up and separates a substrate from the work support unit 127 when changing a work, and a control unit 130 which controls operations of the component units. The base unit 121 is grounded.

The coating apparatus 100 moves and positions the work support unit 127 in two directions of X and Y axes, so that the discharge unit 123a is set directly above a required position (a coating area) on a substrate.

A coating area becomes an electrical circuit 112a to be formed on the substrate 112, for example. The container unit 122 is moved down in the state in which the discharge unit 123a is opposed to the substrate 112, and the distance from the discharge unit 123a to the substrate 112 is set to a required value.

In this state, the pressure unit 125 supplies compressed air to the container unit 122, and the discharge unit 123a discharges the paste material S. One coating cycle is completed by the above operations.

After coating a required area, the container unit 122 is moved up, and the substrate 112 is moved to the next position. A plurality of areas of the substrate are coated by repeating this step (refer to Jpn. Pat. Appln. KOKAI Publication No. 2006-153971, for example).

When the coating operation required for one substrate 112 is finished, the upthrust mechanism 128 is operated, the substrate 112 is moved up from the work support unit 127, and replaced by another substrate, and the same coating operation is repeated for the new substrate as the next coating object. The above operations are repeated for coating a plurality of substrates 112.

However, the above technique has the following problems. Each time a coating operation is repeated, a discharge unit or paste material contacts and separates from a substrate or an electrical circuit. Electric charge is transferred by the repetition of contacting and separation. As the base unit is grounded, electric charge is imparted at every coating operation. Therefore, a substrate is electrically charged if the coating operation is repeated.

BRIEF SUMMARY OF THE INVENTION

According to an aspect of the invention, a coating apparatus comprises, a container unit which contains liquid, a container support unit which supports the container unit, a work support unit which supports a work oppositely to a discharge unit of the liquid in the container unit, a base unit which supports the container support unit, and is grounded, and an insulating unit which is provided between the base unit and discharge unit, and insulates the base unit and discharge unit.

According to another aspect of the invention, a coating apparatus comprises, a container unit which contains liquid, a container support unit which supports the container unit, a work support unit which supports a work oppositely to a discharge unit of the liquid in the container unit, a base unit which supports the container support unit, and is grounded, and a switching unit which is provided between the base unit and discharge unit, and switches states of imparting electric charge to the discharge unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

Figure 1:
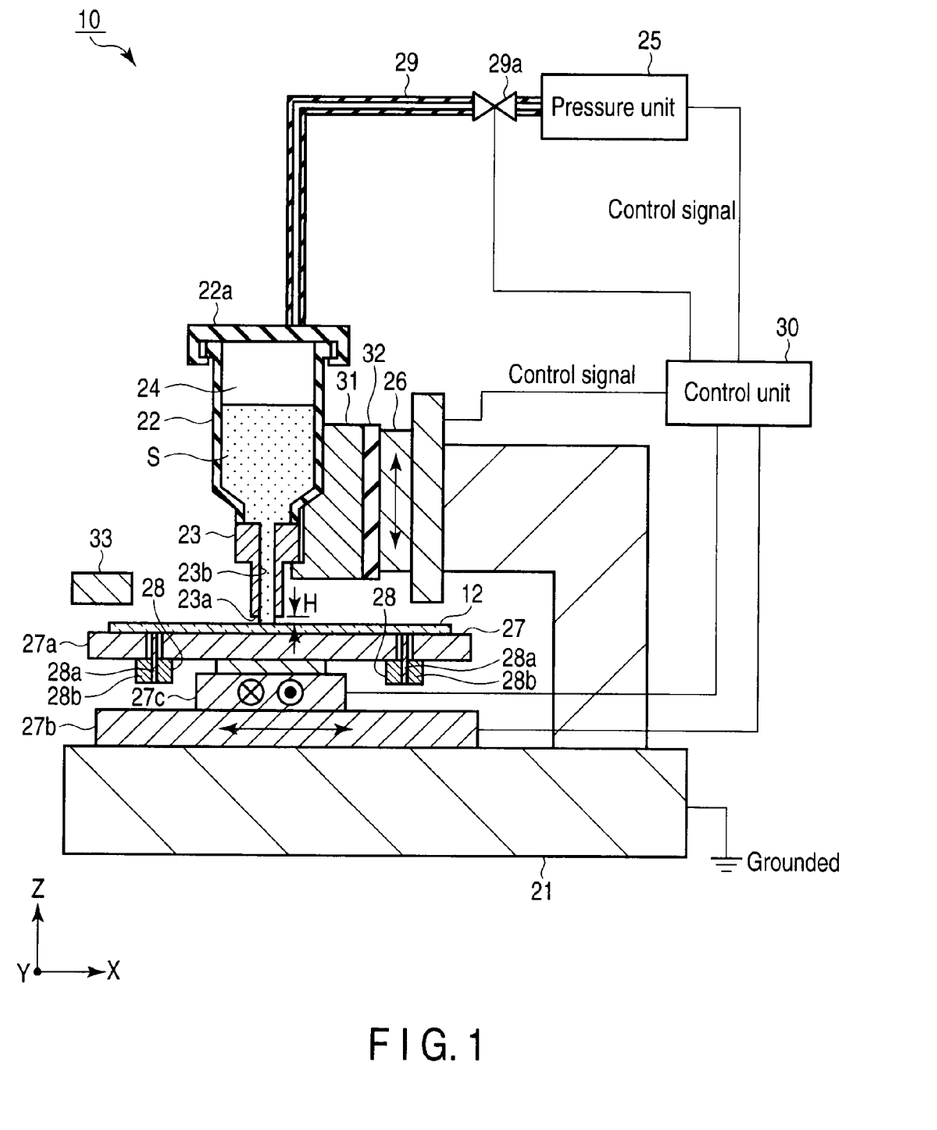
FIG. 1 is an explanatory drawing showing a configuration of a paste coating apparatus according to a first embodiment of the invention.
Figure 2:
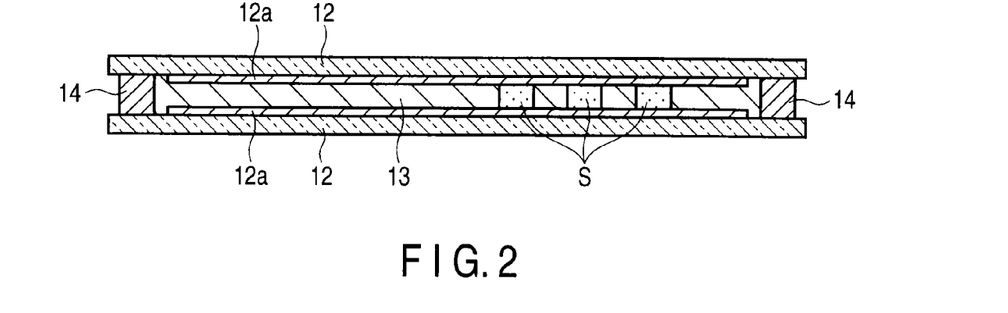
FIG. 2 is a sectional view of a flat panel display according to the same embodiment.

Hereinafter, an explanation will be given of a paste coating apparatus 10 that is a coating apparatus according to a first embodiment of the invention with reference to FIGS. 1 and 2. For convenience of explanation, the configuration is appropriately magnified, contracted or omitted in the drawings. FIG. 1 is an explanatory drawing showing a configuration of a paste coating apparatus 10 according to a first embodiment of the invention. FIG. 2 is a sectional view of a flat panel display 11.

The paste coating apparatus 10 is used to apply a coat of paste material S as conductive liquid for electrically connecting electrical circuits of two substrates 12, in manufacturing a flat panel display 11 such as a liquid crystal display (LCD), for example.

The paste coating apparatus 10 comprises a base unit 21, a dispenser 24 having a container unit 22 containing the paste material S, a pressure unit 25 as a pressurizing unit connected to the container unit 22, a container support unit 26 which supports the dispenser 24 on the base unit 21, a work support unit 27 which supports a substrate as a work oppositely to the discharge unit 23a of the dispenser 24, an upthrust mechanism 28 which moves up a work from the work support unit when changing a work, and a control unit 30 which controls operations of the component units. The base unit 21 is grounded.

The flat panel display 11 such as a liquid crystal display (LCD) is configured such that a liquid crystal 13 is filled between two substrates 12, and sealed by a sealing agent 14, as shown in FIG. 2. An electrical circuit 12a is formed on each substrate 12 as a work, and the electric circuits 12a are connected through the paste material S. In other words, an area of coating the paste material S is set in a conductive area on the electric circuit 12a.

The work support unit 27 comprises a stage unit 27a configured to be a square flat plate made of metallic material, and positioning mechanisms 27b and 27c which support the stage unit 27a movably and settably on the X- and Y-axes with respect to the base unit 21.

The dispenser 24 comprises a container unit 22 containing the paste material S, and a nozzle unit 23 provided at the front end of the container unit 22.

The container unit 22 is made of insulating material such as resin, and is formed cylindrical with the front-end diameter set small. The container unit 22 is fixed to the container support unit 26 with the front end faced down. The container unit 22 stores conductive paste material S that is a pasty adhesive.

The upper end of the container unit 22 is opened. A connection end 22a, which connects a communicating tube 29 to the pressure unit 25, is mounted on the opened upper end. The connection end 22a is made of insulating material.

The paste material S stored in the container unit 22 is composed of a conductive adhesive including organic solvent and silver particles.

The nozzle unit 23 is made of metallic material such as SUS, and comprises a discharge unit 23a, and a discharge port 23b communicating from the discharge unit 23a to the inside of the container unit 22. When compressed air is supplied to the container unit 22, the discharge unit 23a discharges the paste material S through the discharge port 23b.

The pressure unit 25 is a so-called compressor, which pressurizes the paste material S in the dispenser 24, so that the paste material flows out through the nozzle unit 23.

The container support unit 26 is a so-called elevator unit, which is provided on the base unit 21, and moves along the Z-axis without changing the position. The container support unit 26 is electrically connected to the control unit 30, and determines the distance from the discharge unit 23a of the nozzle unit 23 to the coating surface by the position control for the dispenser 24.

The dispenser 24 is fixed to the container support unit 26 with support hardware 31.

An insulating unit 32 made of insulating material is provided between the support hardware 31 and container support unit 26, so that the support hardware 31 and dispenser 24 are electrically insulated from the container support unit 26. The insulating unit 32 is a plate member made of resin, for example, and prevents potential being imparted to the dispenser 24.

The upthrust mechanism 28 is provided in the work support unit 27, and comprises a metallic pin member 28a, and an elevating mechanism 28b which elevates the pin member. For example, when a substrate is replaced after predetermined areas of a substrate 12 are coated, the pin member 28a is moved up, and the substrate 12 is separated from the work support unit 27.

The communicating tube 29 is made of insulating resin material, and electrically insulates the pressure unit 25 and dispenser 24.

An electromagnetic on-off valve 29a is provided in midstream of the communicating tube 29 communicating the pressure unit 25 and dispenser 24, and is on-off controlled by a signal from the control unit 30.

An electrometer 33 as a potential detection unit is provided above the work support unit 27, and measures the potential of the substrate 12 when the substrate 12 is moved up by the upthrust mechanism 28.

Hereinafter, an explanation will be given of the operation of coating the paste material S on the coating surface in the paste coating apparatus 10 with reference to FIGS. 3 to 5. Here, a lot of areas of the substrate 12 are coated with the paste material S.

First, the nozzle unit 23 and dispenser 24 are move down by driving the container support unit 26, and positioned to get a predetermined space H between the nozzle unit 23 and the coating surface.

In the state in which the dispenser 24 is positioned so that the distal end of the nozzle unit 23 is faced to the coating surface, the pressure unit 25 supplies compressed air to the inside of the dispenser 24. The paste material S in the dispenser 24 is squeezed out by the outflow pressure, and is supplied from the discharge unit 23a to the coating surface through the discharge port 23b of the nozzle unit 23.

As the space H is provided between the coating surface and the lower surface of the discharge unit 23a of the nozzle unit 23, the paste material S is supplied along the space H, spreading flatly on the coating surface.

After a predetermined amount of paste material Sa is supplied, the electromagnetic on-off valve 29a is closed to interrupt flow of compressed air and discharging of the paste material S. The container support unit 26 moves up the dispenser 24 together with the nozzle unit 23.

The paste material Sa discharged from the discharger unit 23a of the nozzle unit 23 remains on the coating surface. The paste material Sa is coated on the coating surface along the shape of the nozzle unit 23.

Figure 3:
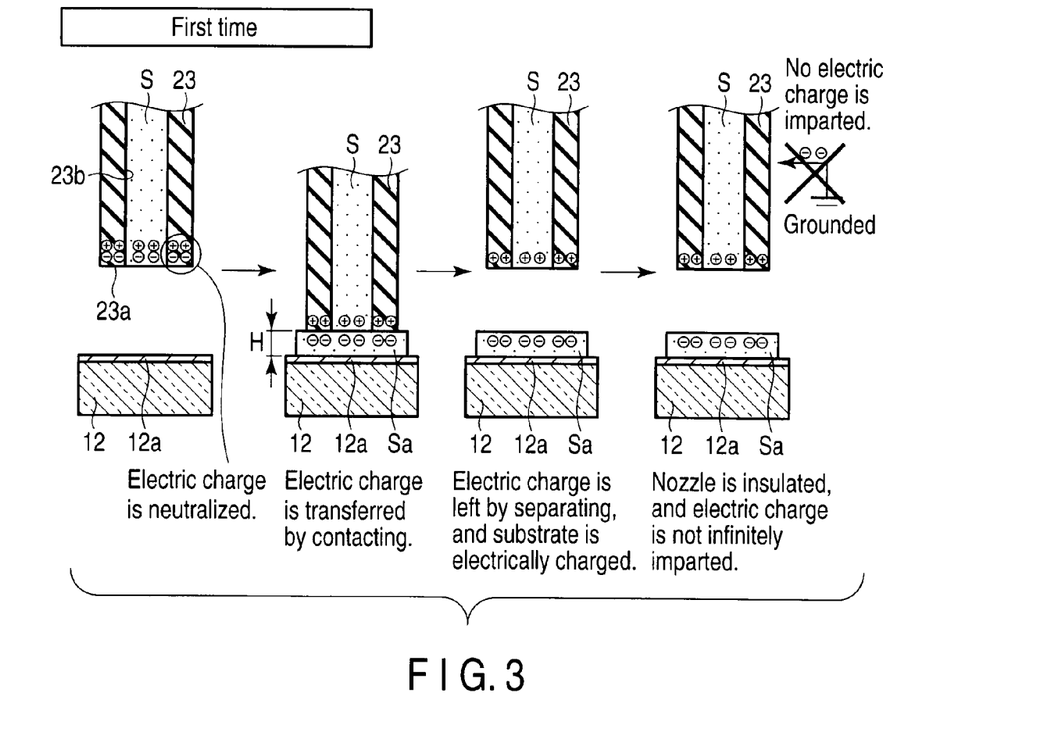
FIG. 3 is an explanatory drawing showing a first time coating operation of the paste coating apparatus, and states of electric charge, in the same embodiment.

As shown in FIG. 3, in the first time coating operation, contact and separation between the metallic nozzle unit 23 and paste material S causes shortage of negative charge in the nozzle unit 23 and conductive paste material S.

As the container unit 22 is made of insulating material and the insulating unit 32 is provided, the container unit is insulated from the grounded base unit 21, and no more electric charge is imparted.

Figure 4:
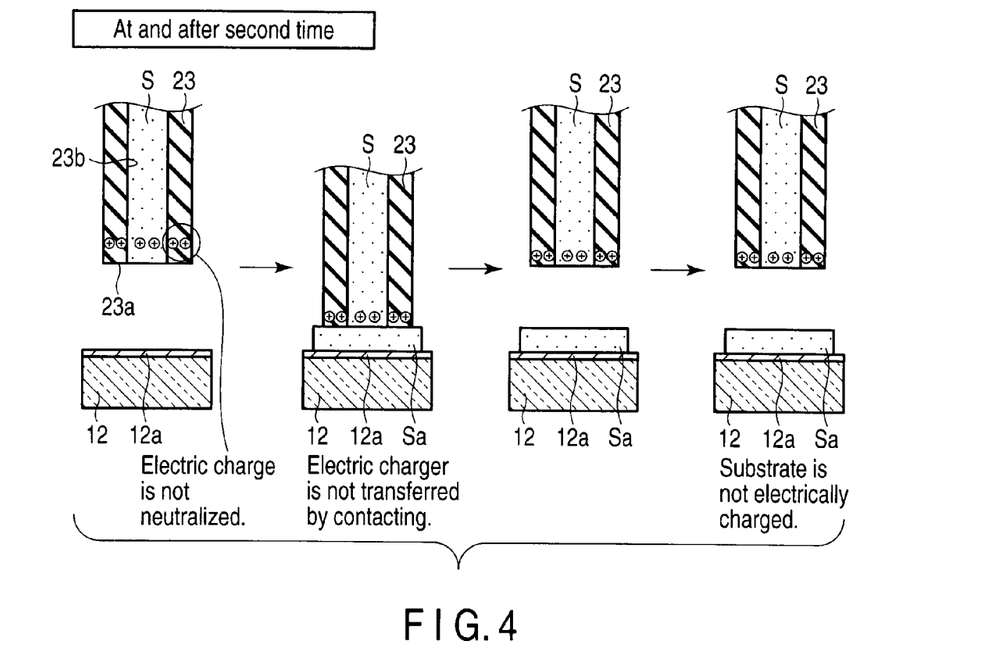
FIG. 4 is an explanatory drawing showing a second and subsequent coating operations, and states of electric charge in the paste coating apparatus according to the same embodiment.
Figure 5:
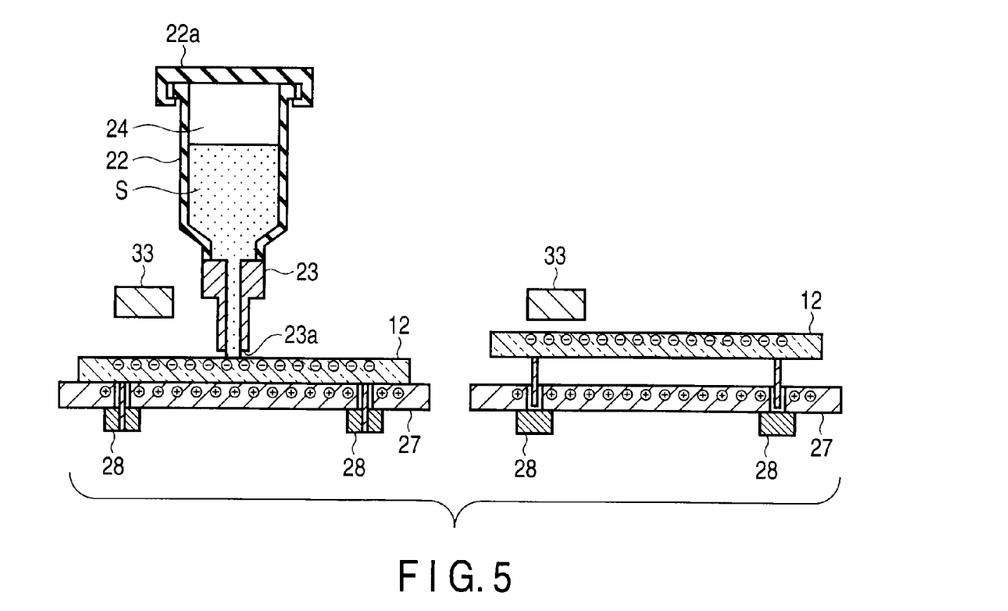
FIG. 5 is an explanatory drawing showing an operation to be executed when a work is replaced, and states of electric charge, in the same embodiment.

Therefore, negative charge is not imparted when the conductive paste material S is coated on a substrate at and after a second time coating operation as shown in FIG. 4. In other words, as negative charge is shorting in the first time coating operation, little or no negative charge is imparted to the substrate 12 at and after a second time coating operation. This prevents charging of the substrate 12. Electric potential is expressed in two signs, positive and negative. This example assumes negative potential.

The conductive paste material S is coated in a plurality of areas, 500 areas for example, by repeating the above coating operation a plurality of times, 500 times for example.

Next, after a predetermined area is coated, the upthrust mechanism 28 is operated, and the substrate 12 is moved up and separated from the work support unit 27. At this time, the potential is measured by the electrometer 33 located upward.

As a comparative example, an explanation will be given of a charging phenomenon in the paste coating apparatus 100 shown in FIG. 10, with reference to FIG. 11.

The paste coating apparatus 100 shown in FIG. 10 comprises a base unit 121, a container unit which is supported movably up and down in the base unit 121, a pressure unit which supplies compressed air to the inside of the container unit 122, and discharges paste material S from a discharge unit 123a provided at the front end of a container, a work support unit 127 which holds a work movably, an upthrust mechanism 128 which moves up and separates a substrate from the work support unit 127 when changing a work, and a control unit 130 which controls operations of the component units. The base unit 121 is grounded.

An explanation will be given of the mechanism of generating static electricity in the paste coating apparatus 100. As shown in FIG. 11, the nozzle unit 123 and conductive paste material S are not insulated from the base unit 121 before the coating operation. Thus, potential is zero, and positive and negative charges are neutralized.

When the nozzle unit 123 and conductive paste material S contact and separate from a substrate, the negative charges in the discharge unit 123a of the nozzle unit 123 and the conductive paste material S are moved to the substrate.

After the discharge unit 123a is separated from the substrate 112 by the elevation of the container unit 22, as the nozzle unit 123 and conductive paste material S are grounded, shorted negative charge is inexhaustibly imparted. Thus, the electric charge is neutralized, and the potential becomes zero.

The above phenomenon occurs whenever the conductive paste material S is coated, and the number of coating points becomes proportional to the amount of static charge (the potential of a substrate).

Figure 11:
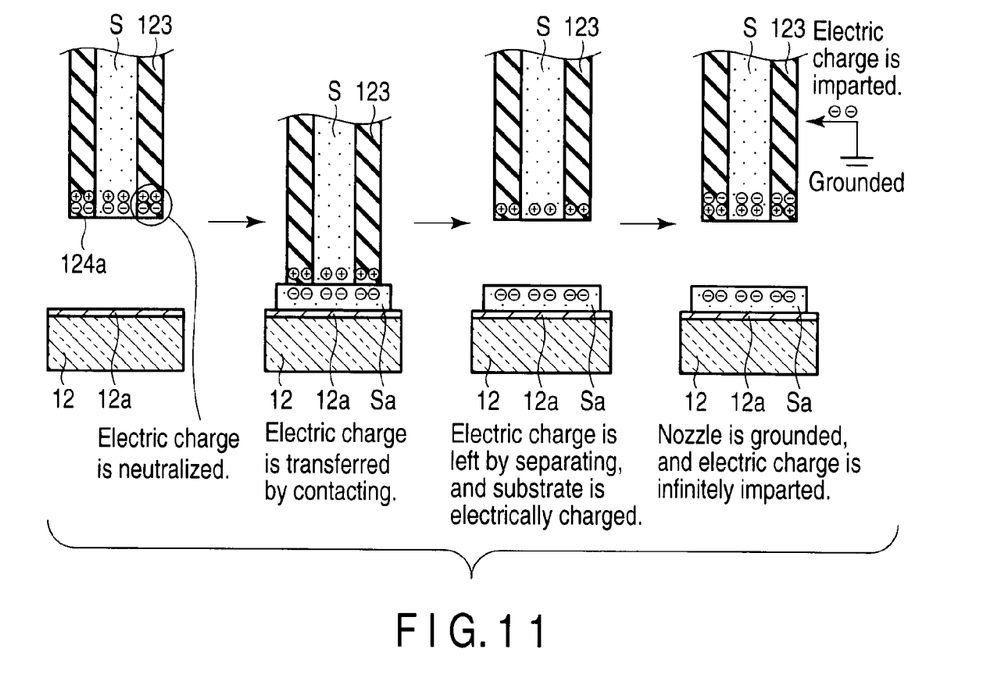
FIG. 11 is an explanatory drawing showing a coating operation, and states of imparting electric charge, in an example of a paste coating apparatus.

As the work support unit 127 is made of metal, the substrate 112 is negatively charged, and positive electric charge is collected in the work support unit 127, as shown in FIG. 11. As the substrate 112 is grounded, positive charge is inexhaustibly imparted, and the positive and negative charges are balanced. Further, as the electrometer measures electric charge, positive and negative charges are set off, and potential is not observed on the substrate.

After many areas of the substrate 112 are coated with the paste material S, the substrate 112 is elevated by the upthrust mechanism 128, separated from the work support unit 27, and moved close to an electrostatic meter. The electrostatic meter measures the potential of the substrate generated by the negative charge. As a result, when the pin member 28a separates the substrate from the work support unit 27, the electrometer 133 observes several thousand volts of potential. Electric potential is expressed in two signs, positive and negative. This example assumes negative potential.

This embodiment provides the following effects. Imparting of electric charge by grounding is interrupted by insulating the nozzle unit 23, dispenser 24, and support hardware 31 from the base unit 21. Therefore, while the discharge unit 23a or paste material S repeatedly contact and separate from the substrate 12 or electrical circuit 12a in repeated coating operations, repetition of the charging phenomenon is prevented by interrupting the imparting of electric charge. In other words, as electric charge is not imparted at and after a second time repetition of contact and separation, a substrate is not electrically charged, and is prevented from storing of electric charge. Further, in the first time coating operation, the substrate 12 may be charged, but considering that coating is made at several hundred or thousand points in one substrate, and the number of coating points is proportional to the charging potential, one time charging is negligibly small.

Further, in this embodiment, the container unit 22, connection end 22a, and communicating tube 29 are made of insulating resin material, and the dispenser 24 can be securely insulated.

Second Embodiment

Figure 6:
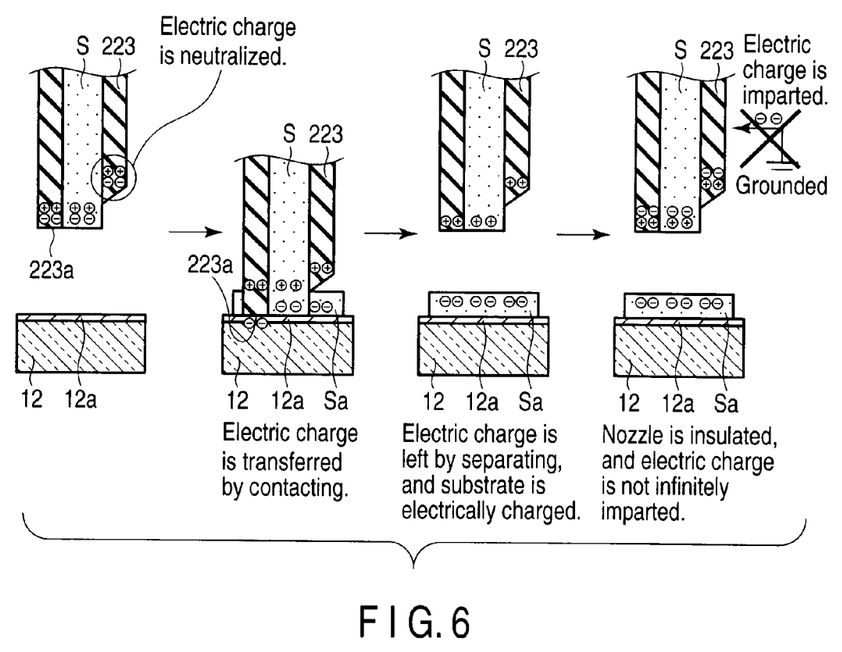
FIG. 6 is an explanatory drawing showing a coating operation, and states of imparting electric charge, in a second embodiment of the invention.

Hereinafter, an explanation will be given of a paste coating apparatus 10 according to a second embodiment of the invention with reference to FIG. 6. For convenience of explanation, the configuration is appropriately magnified, contracted or omitted in the drawing. The configuration of the second embodiment is the same as that of the first embodiment except that the distal end of a nozzle 223 is tapered, and detailed explanation thereof is omitted.

In the paste coating apparatus 10 according to this embodiment, a nozzle unit 223 is tapered and sharp-pointed at the distal end. In the paste coating apparatus 10, as shown in FIG. 6, a part of a discharge unit 223a at the distal end of the nozzle unit 223 contacts a substrate 12 during a coating operation. In this case, electric potential is generated between the distal end of a SUS nozzle 223 and a coating area of the substrate 12.

In this embodiment, as in the first embodiment, electric potential is generated by repetition of contact and separation during a coating operation. As the apparatus is insulated by the insulating unit 32, insulative communicating tube 29, and insulative container unit 22, electric charge is not imparted at and after a second time coating operation, and a substrate is prevented from being charged. Therefore, the second embodiment provides the same effects as the first embodiment.

Third Embodiment

Figure 7:
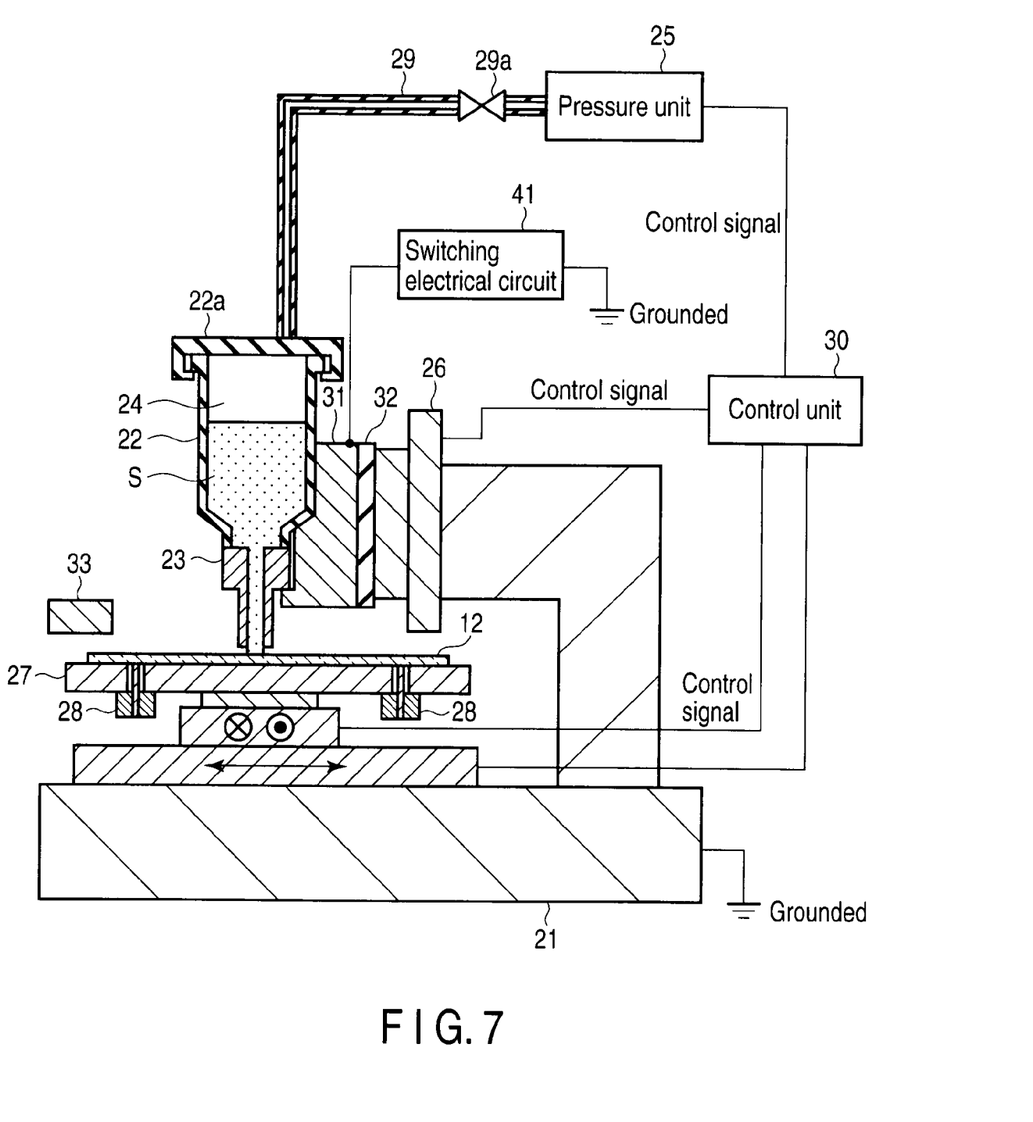
FIG. 7 is an explanatory drawing showing a configuration of a paste coating apparatus according to a third embodiment of the invention.

Hereinafter, an explanation will be given of a paste coating apparatus 10 according to a third embodiment of the invention with reference to FIGS. 7 and 8. For convenience of explanation, the configuration is appropriately magnified, contracted or omitted in the drawings. The configuration of the second embodiment is the same as that of the first embodiment except that an electrical circuit is connected, and detailed explanation thereof is omitted.

In the paste coating apparatus 10 according to this embodiment, a switching electrical circuit 41 as a switching unit is connected to support hardware 31 provided on a base unit 21, providing a function of switching a resistor connected to the support hardware 31.

Figure 8:
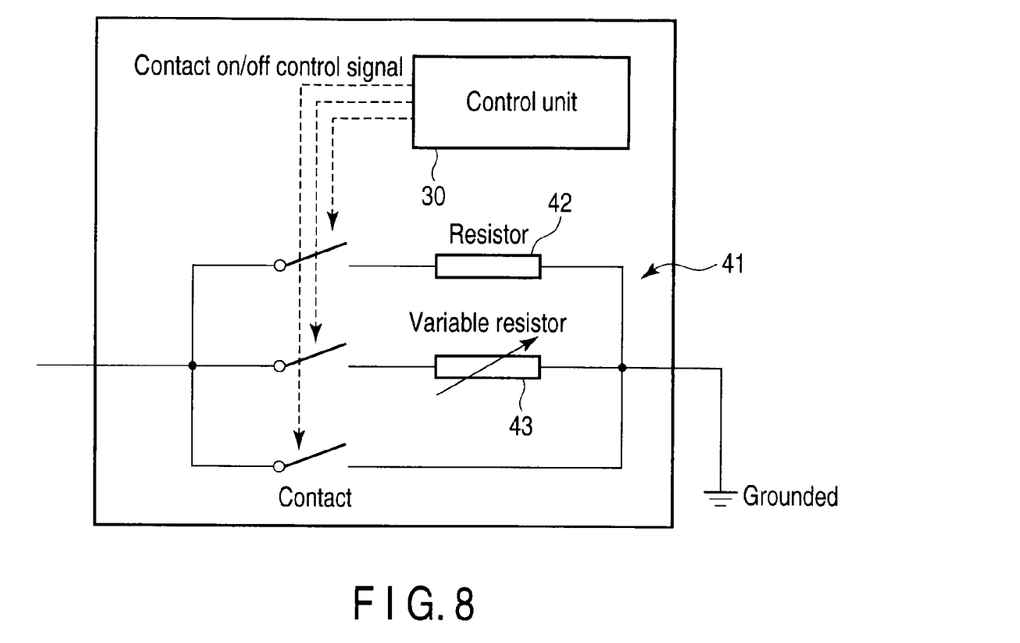
FIG. 8 is an explanatory drawing showing an electrical circuit in the same embodiment.

As shown in FIG. 8, the switching electrical circuit 41 has a plurality of on-off contacts. The other ends of the contacts are grounded through a resistor 42 or a variable resistor 43, or directly grounded. By turning on and off the contacts, connection is switched for grounding through the resistor 42 or variable resistor 43, and for grounding directly. As a result, electric charge imparting states can be switched.

As an example of control of switching, connection is switched when a work is replaced by the next substrate after completion of a series of coating operation (e.g., 1,000 times) for one substrate 12, or when a predetermined number of coating operations based on the number of strikes is completed.

This embodiment provides the same effects as the first embodiment. The dispenser 24 is prevented from having electric charge infinitely imparted, and prevented from being electrically charged. Further, according to this embodiment, it is possible to switch electric charge imparting states according to states of coating operation.

Fourth Embodiment

Figure 9:
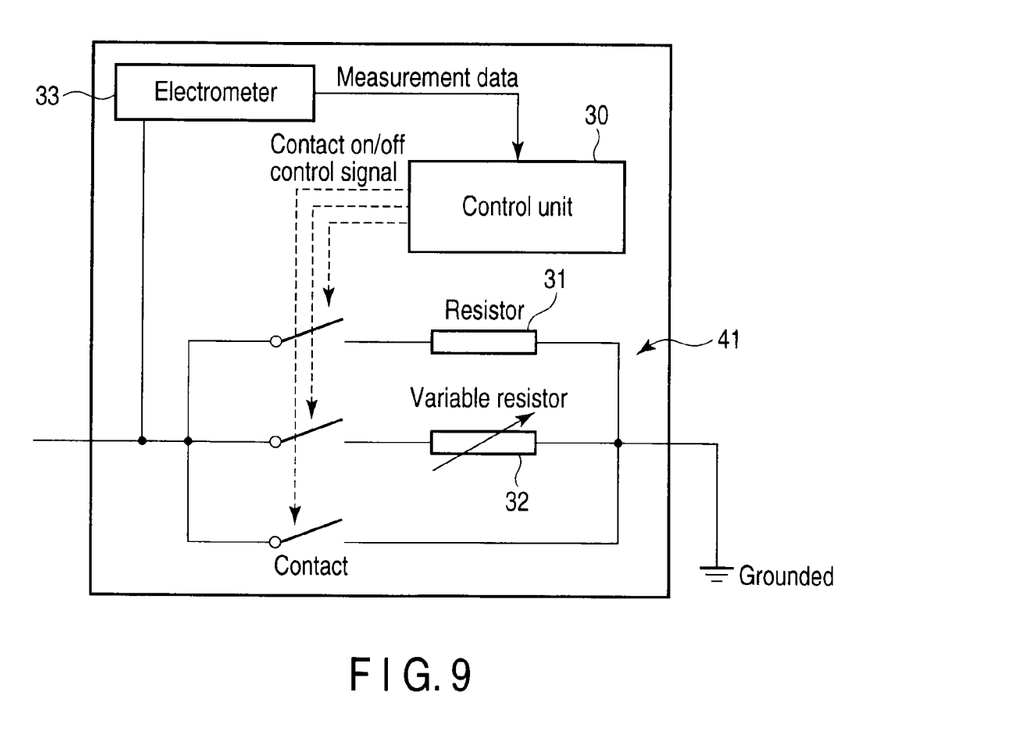
FIG. 9 is an explanatory drawing showing an electrical circuit in a fourth embodiment of the invention.

Hereinafter, an explanation will be given of a paste coating apparatus 10 according to a fourth embodiment of the invention with reference to FIG. 9. For convenience of explanation, the configuration is appropriately magnified, contracted or omitted in the drawing. The configuration of the second embodiment is the same as that of the third embodiment except that an electrometer 33 is connected, and connection is switched based on the values of measured potential, and detailed explanation thereof is omitted.

In the paste coating apparatus 10 according to this embodiment, a switching electrical circuit 41 as a switching unit is connected to support hardware 31 provided on a base unit 21, providing a function of switching resistance connected to the support hardware 31.

As shown in FIG. 8, a switching electrical circuit 41 has a plurality of on-off contacts. The other ends of the contacts are grounded through a resistor 42 or a variable resistor 43, or directly grounded. By turning on and off the contacts, connection is switched for grounding through the resistor 42 or variable resistor 43, or for grounding directly. As a result, electric charge imparting states can be switched.

A control unit 30 is connected to an electrometer 33, and the contacts are turned on and off according to the potential of a dispenser 24 measured by the electrometer 33.

For example, the electrometer 33 measures the potential of the insulated dispenser 24, and the contacts are switched for grounding through the resistor 42 if a measured potential reaches a predetermined first reference value, switched for grounding through the variable resistor 43 if a measured potential reaches a second reference value, and switched for direct grounding if a measured potential does not reach the above reference values.

This embodiment provides the same effects as the third embodiment. The dispenser 24 is prevented from having electric charge infinitely imparted, and prevented from being electrically charged. Further, according to this embodiment, it is possible to keep the potential of the dispenser 24 at an appropriate value by switching electric charge imparting states according to the potential of the dispenser.

The invention is not limited to the embodiments described hereinbefore. The invention may be embodied when practiced by modifying the constituent elements without departing from its spirit or essential characteristics. For example, the whole communicating tube 29 is made of insulating resin in the above embodiments. Only a part of the communicating tube may be made of insulating material. In other words, the communicating tube is configured to have an insulating part. The insulating unit 32 is provided between the container support unit 26 and support hardware 31. The position of the insulating unit is not limited to this. Further, the electrometer 33 is commonly used for measuring the potentials of the dispenser 24 and substrate 12. Another electrometer may be used. The controls executed by the control unit 30 may be separately performed by different control units.

The invention may be embodied in various forms by appropriately combining the constituent elements disclosed in the above embodiments. For example, some elements may be removed from all constituent elements displaced in the above embodiments. The constituent elements of different embodiments may be appropriately combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A coating apparatus comprising:
    a container unit which contains a conductive liquid and includes a discharge unit configured to discharge the conductive liquid;
    a container support unit which supports the container unit at a location opposite to the discharge unit;
    a work support unit which supports a work at a location oppositely to the discharge unit;
    a base unit which supports the container support unit, and which is grounded;
    an insulator which is provided between the base unit and discharge unit, and insulates the base unit from the discharge unit, and
    a control unit configured to control the discharging unit to repeatedly move relatively close to a single work to apply the conductive liquid to the work while being in contact with the conductive liquid, and relatively apart from the work having the conductive liquid applied thereto.

2. The coating apparatus according to claim 1, where the container unit is provided with a nozzle unit having a discharge port communicating the inside of the container unit,
    the distal end of the nozzle unit forms the discharge unit, and
    the container unit is made of insulating material.

3. The coating apparatus according to claim 1, further comprising a pressure unit which is connected to the container unit, and discharges the liquid by supplying compressed air to the container unit,
    wherein the pressure unit and container unit are connected through a communicating tube having at least a part made of insulating material.

4. A coating apparatus comprising:
    a container unit which contains a conductive liquid and includes a discharge unit configured to discharge the conductive liquid;
    a container support unit which supports the container unit at a location opposite to the discharge unit;
    a work support unit which supports a work at a location oppositely to the discharge unit;
    a base unit which supports the container support unit, and is grounded;

an insulator which is provided between the base unit and discharge unit, and insulates the base unit from the discharge unit; and a switch which is provided between the base unit and discharge unit, and switches states of imparting electric charge to the discharge unit to prevent the discharge unit from being electrically charged.

5. The coating apparatus according to claim 4, further comprising a potential detection unit which detects the potential of a dispenser having the discharge unit and container unit, wherein the switch is an electrical circuit configured to switch the state of imparting the electric charge, based on the potential detected by the potential detection unit.

6. The coating apparatus according to claim 1, wherein the discharge unit discharges the liquid with a predetermined space provided between the discharge unit and a coating area of the work.

7. The coating apparatus according to claim 1, wherein the discharge unit discharges the liquid with the discharge unit contacting the coating area of the work.

* * * * *